US009685611B2

(12) United States Patent
Cao et al.

(10) Patent No.: US 9,685,611 B2
(45) Date of Patent: Jun. 20, 2017

(54) MULTI-FACED COMPONENT-BASED ELECTROMECHANICAL DEVICE

(71) Applicant: International Business Machines Corporation, Armonk, NY (US)

(72) Inventors: Qing Cao, Yorktown Heights, NY (US); Kangguo Cheng, Schenectady, NY (US); Zhengwen Li, Scarsdale, NY (US); Fei Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/196,197

(22) Filed: Jun. 29, 2016

(65) Prior Publication Data

US 2017/0084837 A1 Mar. 23, 2017

Related U.S. Application Data

(62) Division of application No. 14/861,358, filed on Sep. 22, 2015.

(51) Int. Cl.
*H01L 21/00* (2006.01)
*H01L 49/00* (2006.01)
(Continued)

(52) U.S. Cl.
CPC ........ *H01L 49/00* (2013.01); *H01L 21/02263* (2013.01); *H01L 21/30625* (2013.01);
(Continued)

(58) Field of Classification Search
CPC ......... H01L 21/02263; H01L 21/30625; H01L 21/465; H01L 27/092; H01L 29/42316; H01L 49/00
See application file for complete search history.

(56) References Cited

U.S. PATENT DOCUMENTS 6,222,513 B1 * 4/2001 Howard ............... G02B 26/026
345/107
6,984,842 B1 1/2006 Nayfeh et al.
(Continued)

OTHER PUBLICATIONS

D. Kuzum et al., "Energy Efficient Programming of Nanoelectronic Synaptic Devices for Large-Scale Implementation of Associative and Temporal Sequence Learning," IEEE International Electron Devices Meeting (IEDM), Dec. 2011, pp. 30.3.1-30.3.4.
(Continued)

*Primary Examiner* — John C Ingham
*Assistant Examiner* — Long H Le
(74) *Attorney, Agent, or Firm* — Vazken Alexanian; Ryan, Mason & Lewis, LLP

(57) ABSTRACT

An electromechanical device comprises a substrate structure, a set of electrodes, one or more anchor trenches, and one or more multi-faced components. For example, each of the one or more multi-faced components comprises an isolation region formed on a first portion of the surface of the component, a high resistance region formed on a second portion of the surface of the component, and a low resistance region formed on a third portion of the surface of the component. For example, the synapse device is configured to provide an analog resistive output, ranging between the high resistance region and the low resistance region, from at least one of the set of electrodes in response to a pulsed voltage input to at least another one of the set of electrodes.

8 Claims, 5 Drawing Sheets

(51) Int. Cl.
*H01L 29/423* (2006.01)
*H01L 21/306* (2006.01)
*H01L 21/465* (2006.01)
*H01L 21/02* (2006.01)
*H01L 27/092* (2006.01)

(52) U.S. Cl.
CPC .......... *H01L 21/465* (2013.01); *H01L 27/092* (2013.01); *H01L 29/42316* (2013.01)

(56) References Cited

U.S. PATENT DOCUMENTS

| | | | | |
|---|---|---|---|---|
| 7,767,017 | B2* | 8/2010 | Lahann | B82Y 10/00 106/401 |
| 8,614,136 | B1* | 12/2013 | Cao | H01L 49/00 257/14 |
| 8,847,287 | B1 | 9/2014 | Cao et al. | |
| 9,029,178 | B2 | 5/2015 | Larrey et al. | |
| 2008/0242774 | A1 | 10/2008 | Lahann et al. | |
| 2012/0068322 | A1 | 3/2012 | Hanabe | |
| 2012/0214001 | A1 | 8/2012 | Little et al. | |
| 2014/0355381 | A1 | 12/2014 | Lal et al. | |
| 2015/0117090 | A1 | 4/2015 | Kim et al. | |

OTHER PUBLICATIONS

J.-S. Seo et al., "A 45nm CMOS Neuromorphic Chip with a Scalable Architecture for Learning in Networks of Spiking Neurons," IEEE Custom Integrated Circuits Conference (CICC), Sep. 2011, 4 pages.

M. Suri et al., "Phase Change Memory as Synapse for Ultra-Dense Neuromorphic Systems: Application to Complex Visual Pattern Extraction," IEEE International Electron Devices Meeting (IEDM), Dec. 2011, pp. 4.4.1-4.4.4.

Wikipedia, "Janus Particles," https://en.wikipedia.org/w//idex.php?title=Janus_particles&printable=yes, May 17, 2015, 15 pages.

Wikipedia, "SyNAPSE," https://en.wikipedia.org/wiki/SyNAPSE, Jul. 8, 2015, 3 pages.

List of IBM Patents or Patent Applications Treated as Related.

* cited by examiner

100

200

300

400

500

800

900

1000

1000

MULTI-FACED COMPONENT-BASED ELECTROMECHANICAL DEVICE

BACKGROUND

A neuromorphic (or cognitive) computing system mimics the processing of the brain for specific applications. Such applications include, but are not limited to, pattern recognition, artificial intelligence, etc. In the brain, a synapse is a structure that permits a neuron (or nerve cell) to pass an electrical or chemical signal to another neuron. Similar to the brain, a neuromorphic computing system is comprised of a large scale network of neuron (processing) devices and adaptive synapse (memory) devices. The neuron device has two main functions. The first main function is to take input from connected synapse devices. If the input is above a predetermined input threshold, the neuron device generates a spike-like output signal that is processed as part of the larger network of neuron devices that then makes some computational decision. This process is referred to as spike-timing dependent plasticity (STDP). The second main function of the neuron device is to change the state of one or more connected synapse devices, where each synapse device in this case functions as a memory device.

Neuron and synapse devices have been implemented on an integrated circuit known as a neuromorphic chip. In one known implementation, the synapse devices are silicon-based devices such as transposable 8-transistor cell static random access memory (8-T SRAM) devices connected in a crossbar array. Other implementations include magnetic RAM (MRAM) or phase change memory (PCM).

SUMMARY

Embodiments provide techniques for forming a multi-faced component-based electromechanical device. In one illustrative implementation, the electromechanical device can be used as a synapse device in a neuromorphic chip.

For example, in one embodiment, an electromechanical device comprises a substrate structure, a plurality of electrodes formed over the substrate structure, an anchor trench formed in operable proximity with the plurality of electrodes, and a multi-faced component formed in the anchor trench. The multi-faced component comprises an isolation region formed on a first portion of the surface of the component, a high resistance region formed on a second portion of the surface of the component, and a low resistance region formed on a third portion of the surface of the component. The electromechanical device is configured to provide an analog resistive-response output, ranging between the high resistance region and the low resistance region, from at least one of the plurality of electrodes in response to a control input.

DETAILED DESCRIPTION

Figure 1:
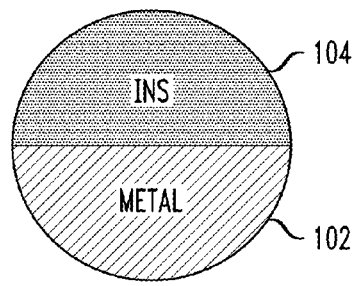
FIG. 1 shows an exemplary spherical Janus component comprising a conductive first portion and an insulating second portion.

Embodiments will now be described in further detail with regard to techniques for forming electromechanical devices such as, for example, micro-electromechanical (MEM) devices and nano-electromechanical (NEM) devices, wherein micro—refers to micrometer scale and nano—refers to nanometer scale. It is to be understood that the various layers, structures, and/or regions shown in the accompanying drawings are schematic illustrations that are not necessarily drawn to scale. In addition, for ease of explanation, one or more layers, structures, and regions of a type commonly used to form electromechanical devices or structures may not be explicitly shown in a given drawing. This does not imply that any layers, structures, and regions not explicitly shown are omitted from the actual devices.

Furthermore, it is to be understood that embodiments discussed herein are not limited to the particular materials, features, and processing steps shown and described herein. In particular, with respect to formation (fabricating or processing) steps, it is to be emphasized that the descriptions provided herein are not intended to encompass all of the steps that may be used to form a functional integrated circuit device. Rather, certain steps that are commonly used in forming such devices, such as, for example, but not limited to, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example, 1% or less than the stated amount. Also, in the figures, the illustrated scale of one layer, structure, and/or region relative to another layer, structure, and/or region is not necessarily intended to represent actual scale.

As will be illustratively described herein, embodiments provide MEM and NEM devices (e.g., transistors) and circuits for ultra-low-power integrated circuit applications (e.g., neuromorphic computing-based applications). In such embodiments, a multi-faced component is used as part of the MEM/NEM devices. Formation of such a multi-faced component will be described from the perspective of a starting point of a Janus component (i.e., Janus particle, cylinder, prism, or some suitable, similarly functional, nano- or micro-particle) and techniques for the fabrication thereof.

A Janus component is a particle, cylinder, prism, etc., the surface of which has two distinct physical properties. For instance, the Janus component could be composed of two different materials. In order to form complementary devices/circuits, such devices employ complementary positively and negatively charged Janus components, the position and rotation of which is controlled by pairs of negatively and positively charged back gates. Electrical contact is formed in the devices when the Janus components form a bridge between the device's source and drain contacts. An example of such a Janus component-based device is described in U.S. Pat. No. 8,847,287 issued on Sep. 30, 2014, and entitled "Janus Complementary MEMS Transistors and Circuits," the disclosure of which is incorporated by reference herein in its entirety.

However it is realized herein that while such a Janus component-based device is able to provide a switched binary output (e.g., logic high or logic low), some applications such as neuromorphic computing-based applications would benefit from an analog output response (i.e., analog resistive-response output). Embodiments provide such an analog output response using a multi-faced component having more than two physical properties, as will be described in further detail herein. Such multi-faced components may be employed as part of MEM/NEM devices that form synapse devices in a neuromorphic chip. More particularly, a MEM/NEM device formed with multi-faced components according to embodiments emulates the biological synapse by gradually increasing (long term potentiation (LTP)) or decreasing (long term depression (LTD) its conductance in response to neuron spikes.

By way of example only, multi-faced component-based MEM/NEM devices can be respectively used in place of the 8-T cell SRAM devices in a crossbar array of a neuromorphic chip. Given the teachings herein, one of ordinary skill in the art will realize many more implementations and uses of multi-faced component-based MEM/NEM devices formed according to embodiments described herein.

Before describing formation of a multi-faced component and devices employing such multi-faced components according to illustrative embodiments, exemplary Janus components structures for use with such components will first be described. It is realized that a Janus component has two faces. As such, the term "multi-faced" as used herein is intended to refer to components that have more than two faces (and thus more than two properties).

There are several methods known for fabricating Janus components. One method includes self-assembly of block copolymers and mixtures of ligands on the surfaces of the components. Another method includes a masking step in which particles are trapped at the interface between two phases, so that a modification to the particle surface is made only on one side. Yet another method includes a phase separation of two different substances, usually either two polymers or a polymer and an inorganic material.

As illustrated in FIG. 1, a Janus component 100 includes a first portion 102 made of a first material which is an electrically conducting material such as a metal, and a second portion 104 made of a second material which is an electrically insulating material such as a dielectric material (e.g., an oxide or nitride dielectric material). It is to be appreciated that while the Janus component 100 is illustrated as a sphere in FIG. 1, it can alternatively be in the form of other shapes such as a cylinder or prism. Also, the two portions of the Janus component need not be the same size (e.g., such as is the case with a Janus prism).

The spherical Janus component 100 shown in FIG. 1 has one hemisphere 102 composed of a metal (e.g., gold (Au)) and a second hemisphere 104 composed of a dielectric material (e.g., an oxide dielectric material). Thus, one portion of the component is electrically conductive and another portion is not electrically conductive. While Au is a suitable metal for use in a Janus component, other suitable metals for use as the electrically conductive portion in the Janus component may include, but are not limited to, copper (Cu), aluminum (Al), silver (Ag), and palladium (Pd). The geometries of the Janus component are scalable. In the case of a Janus component such as that shown in FIG. 1, the dimensions of the component may be measured based on the diameter of the component. By way of example only, a Janus component may have a diameter of from about 20 nanometers (nm) to about 20 micrometers (m). More specifically, when the Janus component has a diameter of from about 100 nm to about 20 μm it is considered to be a Janus micro-component (or micro-particle), and when the Janus component has a diameter of from about 20 nm to about 100 nm it is considered to be a Janus nano-component (or nano-particle).

Janus components are used to form devices and circuits, wherein one or more of the Janus components in the device is/are positively charged and one or more other of the Janus components in the device is/are negatively charged. To do so, a fixed (positive or negative) charge is created on the surface of the metal portion and/or on the surface of the dielectric portion of the Janus components using conventional techniques.

More specifically, a fixed negative charge can be created on the surface of the dielectric portions of the Janus components using a molecule containing a hydroxamic group and negatively charged functional groups (e.g., pyridine groups). A hydroxamic group is preferred for anchoring the molecules to a dielectric (e.g., oxide or nitride) surface. Thus, by way of the hydroxamic group, the molecules will self-assemble on the surface of the dielectric portions of the Janus components forming a (self-assembled) monolayer on those dielectric surfaces bearing a negative charge. In the same manner, a fixed positive charge can be created on the surface of the dielectric portions of the Janus components using a molecule containing a hydroxamic group and positively charged functional groups (e.g., diazonium groups). As provided above, based on the affinity of the hydroxamic group for reaction with a dielectric (e.g., oxide or nitride), the molecules will self-assemble on the surface of the dielectric portions of the Janus components forming a (self-assembled) monolayer on those dielectric surfaces bearing a positive charge.

To form a fixed (positive or negative) charge selectively on the surfaces of the metal portions of the Janus components, the same (positively or negatively charged) functional groups can be employed, but another group is needed to anchor the molecule to the metal surface. A suitable anchoring group for a metal surface is a thiol group. Specifically, a fixed negative charge can be created on the surface of the metal portions of the Janus components using a molecule containing a thiol group and negatively charged functional groups (e.g., pyridine groups). Based on the affinity of the thiol group for reaction with a metal (e.g., gold), the molecules will self-assemble on the surface of the metal portions of the Janus components forming a (self-assembled) monolayer on those dielectric surfaces bearing a negative charge. Similarly, a fixed positive charge can be created on the surface of the metal portions of the Janus components using a molecule containing a thiol group and positively charged functional groups (e.g., diazonium groups). Based on the affinity of the thiol group for reaction with a metal (e.g., Au), the molecules will self-assemble on the surface of the metal portions of the Janus components forming a (self-assembled) monolayer on those dielectric surfaces bearing a positive charge.

Illustrative techniques for creating a fixed charge on a Janus component are described, for example, in U.S. patent application Ser. No. 13/665,334 filed on Oct. 31, 2012, entitled "Techniques for Fabricating Janus MEMS Transistors," the disclosure of which is incorporated by reference herein in its entirety.

The fixed charges on the Janus components permit the Janus components to be actuated (e.g., turned/moved/rotated) during operation of the transistor device in response to an applied gate electrical field. The fact that charges of opposite polarity are employed on the components means that the Janus components will react differently to the same applied gate voltage. The opposite charges on the two components will result in the components actuating/turning/moving/rotating differently in response to an applied gate voltage (Vin), resulting in one of two output states (logic high or logic low).

Figure 2:
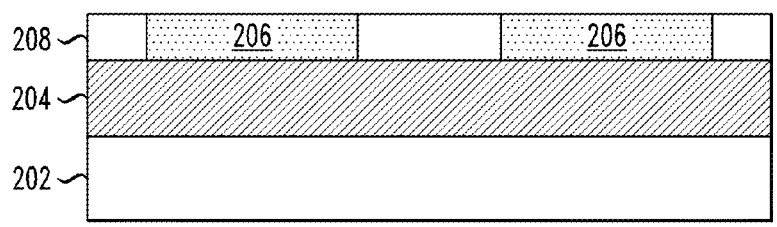
FIG. 2 is a schematic cross-sectional side view of a synapse device illustrating a formation of a back gate, according to an embodiment of the invention.

Processing of Janus components to form multi-faced components that provide analog output response according to illustrative embodiments, as opposed to only a binary output response, will be described below in the context of exemplary methods for fabricating a multi-faced component device presented by way of reference in the structures shown in FIGS. 2-10. Some of the structures shown in FIGS. 2-10 illustrate formation of a plurality of elements in each step (i.e., FIG. 2 shows formation of two back gates, FIG. 5 shows formation of two anchor trenches, etc.). However, the figures are merely illustrative and are not meant to limit alternative embodiments to such structures. Thus, in various embodiments, a device may comprise forming one anchor trench, two anchor trenches or as many anchor trenches as needed to meet a particular purpose. In the case of a synapse device, each back gate, source/drain/gate electrode set, anchor trench and multi-faced component shown in FIGS. 2-10 form one synapse device. Thus, advantageously, the fabrication steps described herein provide for formation of multiple synapse devices using a single common fabrication process.

Embodiments for forming a multi-faced component that provide analog output response will now be described. First, back gates of the device are formed as illustrated in structure 200 of FIG. 2. The starting platform for the fabrication process is a substrate 202 which can be a standard glass, metal, plastic, etc. substrate, or a semiconductor wafer (e.g., bulk semiconductor, silicon-on-insulator (SOI), etc.).

A dielectric layer 204 is then formed on the substrate 202. The dielectric layer 204 can be formed from any suitable dielectric material, including but not limited to, oxide and/or nitride materials. According to an illustrative embodiment, the dielectric layer 204 is formed having a thickness of from about 100 nm to about 10 µm. Next, back gates 206 (e.g., n-type, p-type, or some combination thereof) of the device are formed on the dielectric layer 204.

The back gates 206 can be formed from any suitable conductive gate material, including but not limited to, doped poly-silicon, metal(s), etc. According to an illustrative embodiment, the back gates 206 are formed by depositing a dielectric layer 208 on dielectric layer 204, patterning the dielectric layer 208 with trenches corresponding to the footprint and location of the back gates 206, and filling the trenches with a metal (such as copper), poly-silicon, etc. to form the back gates 206. Any excess gate material can be removed using, e.g., chemical-mechanical polishing (CMP). Further, while the dielectric layer 204 and dielectric layer 208 may be formed from the same material, it may be advantageous to form the dielectric layer 204 and the dielectric layer 208 from different materials, such as an oxide and a nitride (or vice-a-versa), respectively, so as to permit an etch selectivity between the layers during patterning of the trenches.

Figure 3:
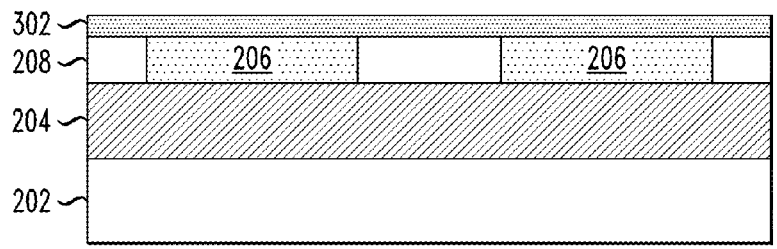
FIG. 3 is a schematic cross-sectional side view of the synapse device of FIG. 2 after depositing an etch stop layer, according to an embodiment of the invention.

An etch stop layer 302 is then formed over and covering the back gates 206 as shown in structure 300 of FIG. 3. The etch stop layer 302 will be used later in the process during the anchor trench formation (i.e., to form the trenches into which the multi-faced components are placed). The etch stop layer 302 will also serve as a dielectric between the multi-faced components and the back gates 206. Accordingly, the etch stop layer is preferably formed from a nitride or oxide dielectric material. By way of example only, the etch stop layer 302 can be deposited using a process such as chemical vapor deposition (CVD) to a thickness of from about 10 nm to about 100 nm.

Figure 4:
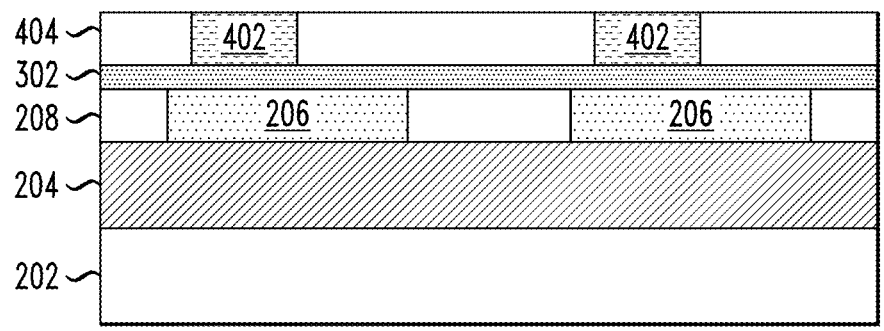
FIG. 4 is a schematic cross-sectional side view of the synapse device of FIG. 3 after forming electrodes over the back gate, according to an embodiment of the invention.
Figure 5:
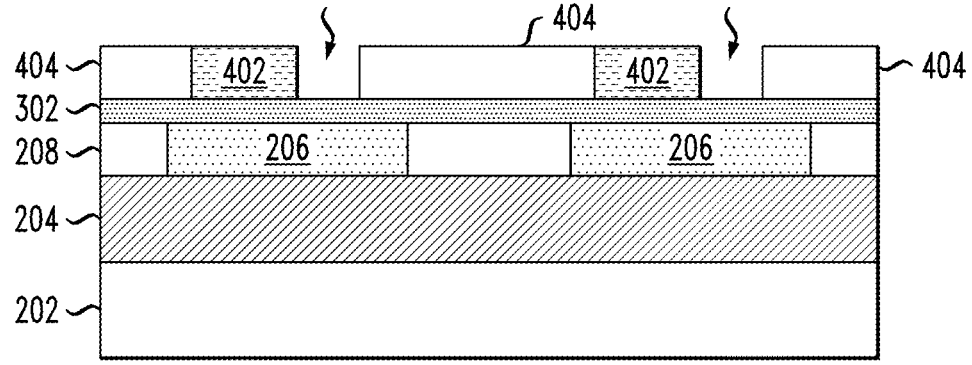
FIG. 5 is a schematic cross-sectional side view of the synapse device of FIG. 4 after forming an anchor trench, according to an embodiment of the invention.
Figure 6:
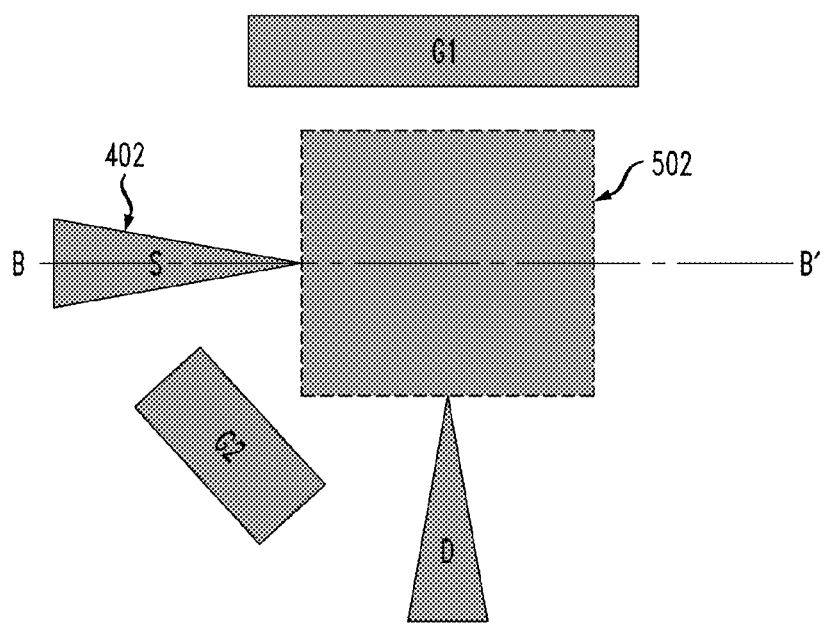
FIG. 6 is a schematic top down view of the synapse device of FIG. 5, according to an embodiment of the invention.

Next, as shown in structure 400 in FIG. 4, electrodes 402 are formed over the back gates 206. An illustrative configuration of the electrodes 402 (i.e., including source, drain and gate electrodes) is shown in FIG. 6, described below. The formation of the electrodes 402 follows a similar process to that described above for forming the back gates. Namely, a dielectric layer 404 is first deposited on the etch stop layer 302, the dielectric layer 404 is patterned with the corresponding footprint and location of the electrodes 402, and the pattern is filled with a conductive material, such as a metal (e.g., copper), poly-silicon, etc. to form the electrodes 402. Any excess conductive material can be removed using, e.g., CMP. Further, as provided above, the etch stop layer 302 is preferably formed from a dielectric material. While the dielectric material used for the etch stop layer 302 may be the same as that used for the dielectric layer 404, it may be advantageous to form the dielectric layer 404 from a different material from the etch stop layer 302, such as an oxide and a nitride (or vice-a-versa), respectively, so as to permit an etch selectivity between the layers during patterning of the dielectric layer 404 to form the electrodes 402, and later to form the anchor trenches, as will be described below.

According to an illustrative embodiment, anchor trenches 502 are formed, as shown in structure 500 in FIG. 5, using standard lithography and etching techniques wherein a mask (not shown) is formed on the dielectric layer 404 patterned with the footprint and location of the anchor trenches 502. A dielectric reactive ion etching (RIE) step can then be used to etch the anchor trenches in the dielectric layer 404. As provided above, the dielectric layer 404 is preferably formed from a different material than the etch stop layer 302, such as an oxide and a nitride (or vice-a-versa), to provide etch selectivity between the materials. The dimensions of the anchor trench will depend on the dimensions of the particular multi-faced components being used, and whether one or more components will be anchored in the trench.

An illustrative configuration 602 of the electrodes 402 and the anchor trenches 502 is shown by way of a top-down view of the device presented in FIG. 6. The depiction shown in FIG. 6 is from viewpoint A (see FIG. 5). As shown in FIG. 6, in this exemplary configuration, the electrodes 402 are patterned to form a pair of gate electrodes (G1 and G2) and source and drain (S and D) electrodes, each corresponding to a multi-faced component device. As shown in FIG. 6, the anchor trench 502 is located between the source (S) and drain (D) electrodes. The multi-faced component will be positioned in the anchor trench 502, as will be further explained below, such that it is in operable proximity to the electrodes. It is to be noted that what is shown in FIG. 5 is a cross-sectional cut along line B-B' in FIG. 6. It is to be further understood that electrode configurations other than the illustrative configuration shown in FIG. 6 can be implemented in accordance with alternative embodiments.

Whichever electrode 402 configuration is employed, the general fabrication process proceeds in the same manner as now described. Namely, as shown in FIG. 5, the anchor trenches 502 are formed in the dielectric layer 404 adjacent to the electrodes 402. By way of reference to FIG. 6, the anchor trenches are formed between the source (S) and the drain (D) electrodes. For illustrative purposes, the placement of the anchor trenches 502 is shown outlined in a dashed pattern in FIG. 6.

As described above, formation of a multi-faced component according to illustrative embodiments starts with a Janus component. While a device using Janus components provides a binary output response, embodiments described herein provide for an analog output response through a multi-faced component-based MEMS/NEM device, which may advantageously operates as a synapse device as part of a neuromorphic chip. As will be explained further below, a multi-faced component comprises isolation (insulator) material on about one half of its surface, conductive high resistivity material on about one quarter of its surface and conductive low resistivity material on the other about one quarter of its surface. The high resistivity level is relative to the low resistivity level and, as such, the actual resistivity levels are dependent on the application in which the multi-faced components are being employed.

In illustrative embodiments, the isolation material has a fixed charge, as explained above. A control gate pair controls the rotation of the multi-faced component. The control gate input is a pulsed voltage. The multi-faced component actuates (e.g., turns, rotates, moves) in response to the pulsed gate voltage. An analog range of resistivity/conductivity from the source/drain electrodes through the multi-faced component is what determines the output of the MEM/NEM device, as will be further explained below.

Many advantages flow from formation and use of a multi-faced component as described herein. By way of example only, such advantages includes: true analog property, non-volatile memory capacity, a simple integration scheme, ability to integrate with CMOS circuits, good reliability, less energy consumption and thus low power requirement, and high density.

Figure 7:
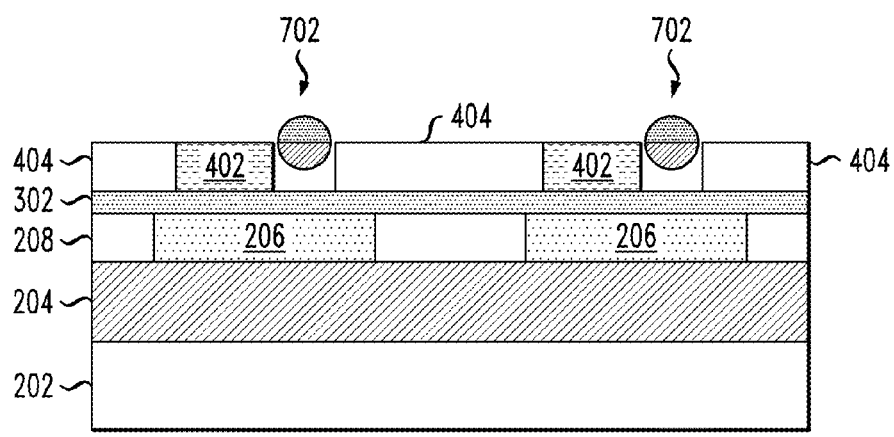
FIG. 7 is a schematic cross-sectional side view of the synapse device of FIG. 5 after introducing a Janus component, according to an embodiment of the invention.
Figure 8:
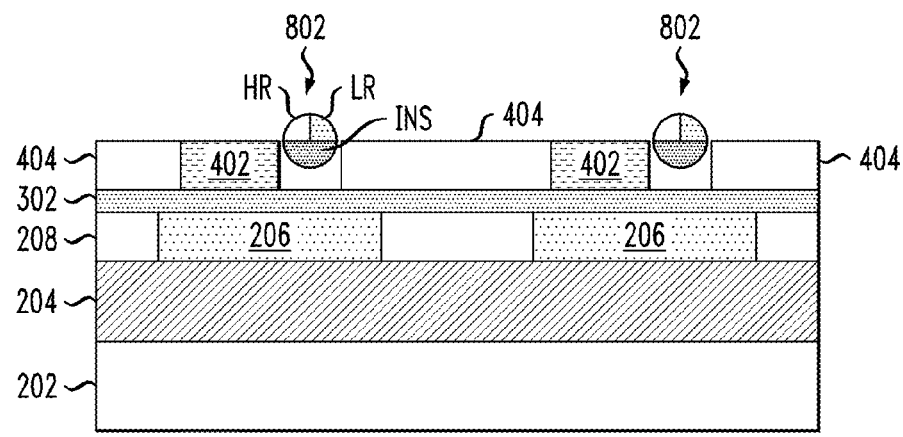
FIG. 8 is a schematic cross-sectional side view of the synapse device of FIG. 7 after forming a high resistivity region on about a quarter of the conductive portion of the Janus component, according to an embodiment of the invention.

Accordingly, Janus components 702 are introduced onto the device as shown in structure 700 in FIG. 7. Introduction of the Janus components 702 into the anchor trenches 502 can be performed in a variety of ways. For example, a chemical approach or a geometric (resist) approach can be employed similar to those described in the above-referenced U.S. Pat. No. 8,847,287.

According to an illustrative embodiment, a positive (V>0) voltage is applied to the back gates 206 while soaking the device in a solution containing Janus components. This causes one or more Janus components 702 to be deposited into the anchor trenches 502 and positioned such that the metal portion (formed, in this case, to be positively charged) faces upward and the dielectric portion (formed, in this case, to be negatively charged) faces the back gates 206. Alternatively, instead of soaking the device in the Janus component solution, the solution can also be spin-coated onto the surface of the device.

In an alternate embodiment, rather than using a chemical approach, the Janus components 702 can be placed in the device using a geometric approach wherein the above-described aqueous solution containing the charged Janus components are contacted (soaked, spin-coated, etc.) with the device through a patterned mask to permit deposition of the Janus components 702 at the proper locations.

With whatever approach is implemented, following placement of the Janus components 702 in the device, the wafer may be rinsed (for example with distilled water) to remove extra deposited Janus components, and the photoresist (if present) can be removed by conventional processes. As described above, the anchor trenches 502 serve to "anchor" the Janus components 702 in place during this rinsing step and the subsequent multi-face processing steps.

It is to be noted that the metal portion (upper hemisphere) of the Janus components 702 has a given resistivity/conductance property based on the above-described formation process. Assume, for example, this resistivity/conductance is considered a "low resistance" (LR) region. As illustrated in structure 800 in FIG. 8, a "high resistance" (HR) region is formed on about half of the LR region, resulting in a multi-faced component 802 comprising isolation (insulator) material (denoted "Ins") on about one half of its surface, conductive high resistivity material (denoted as "HR") on about one quarter of its surface and conductive low resistivity material (denoted as "LR") on the other about one quarter of its surface. Each component 802 has similar regions.

The HR region may be formed over half of the LR region as follows. The HR region is formed via a lithography step followed by etching and direct sputtering of the Janus component 702. During the lithography step, a layer of photoresist is deposited on the Janus component 702 except for a portion of the LR region reserved for the HR region. Then, the metal (low resistivity material) in the LR region not covered by the layer of photoresist is etched away using selective chemical or reactive ion etching. The materials for the HR region such as, titanium nitride (TiN), tantalum nitride (TaN), etc., are then blanket deposited using thermal evaporation, electron-beam evaporation, or direct sputtering. Finally, the layer of photoresist is removed together with metal (high resistivity material) deposited on the layer of photoresist. It is to be appreciated that the back gates 206 maintain a positive voltage during formation of the HR region.

In an alternative embodiment, the resistivity/conductance of the metal portion of the Janus component 702 is considered a HR region. A LR region is formed on about half of the HR region, resulting in a multi-faced component 802 comprising isolation (insulator) material on about one half of its surface, conductive low resistivity material on the other about one quarter of its surface and conductive high resistivity material on about one quarter of its surface. In this embodiment, there is no need for a lithography step followed by etching and direct sputtering of the Janus component 702.

A liquid coating can be deposited over/surrounding the device, covering the multi-faced components. The liquid coating serves as an insulator and prevents arcing between the electrodes. The liquid coating may also be referred to herein as a "liquid packaging," and may be formed from an oil-based media (such as, e.g., a commercially available highly refined transformer oil that is free of water vapor) or an insulating liquid. Fabrication of the multi-faced component-based MEM/NEM device may now be considered complete.

It is to be noted that the back gates 206 serve primarily during fabrication to place the components in the proper locations, as described immediately above. The electrodes 402 (of the various configurations mentioned herein) are used to operate the device.

Figure 9:
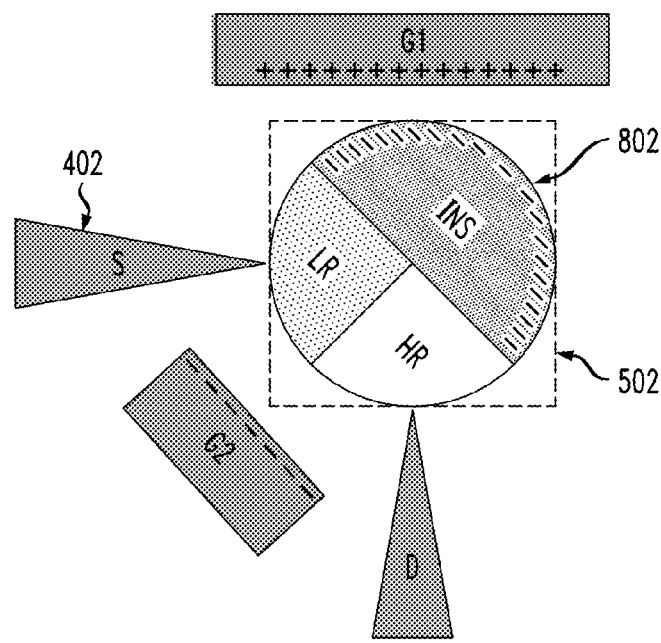
FIG. 9 illustrates operation of the synapse device of FIG. 8 comprising a multi-faced component, according to an embodiment of the invention.

FIGS. 9 and 10 illustrate operation a synapse device comprising a multi-faced component. FIG. 9 is a top-down view of the device presented in FIG. 8. The depiction shown in FIG. 9 is from viewpoint A (see FIG. 8). As shown in FIG. 9, in this exemplary configuration, the isolation material has a fixed negative charge. The multi-faced component 802 introduced inside the anchor trench 502 actuates in response to a pulsed gate voltage applied to the control gate pair G1 and G2. For example, a combination of a positive voltage applied to G1 and a negative voltage applied to G2 positions the multi-faced component 802 so that the source electrode is in contact with the low resistance region of the multi-faced component 802 and the drain electrode is in contact with the high resistance region of the multi-faced component 802. As explained previously, a MEM/NEM device formed with multi-faced components according to the embodiments may emulate a biological synapse device gradually increasing or decreasing its conductance in response to neuron spikes. In structure 900, the pulsed gate voltage applied the control gate pair actuates the multi-faced component 802 with respect to the source and drain electrodes, generating a gradually increasing or decreasing analog resistive-response output.

Figure 10A:
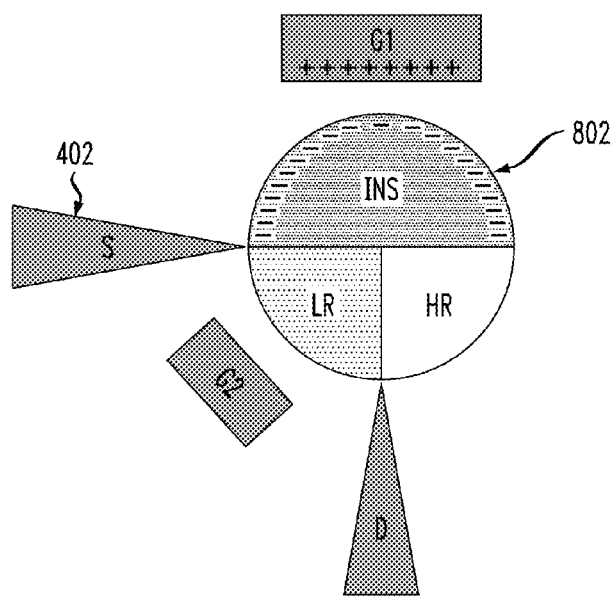
FIG. 10A illustrates further operation of the synapse device of FIG. 9 generating a maximum output current, according to an embodiment of the invention.
Figure 10B:
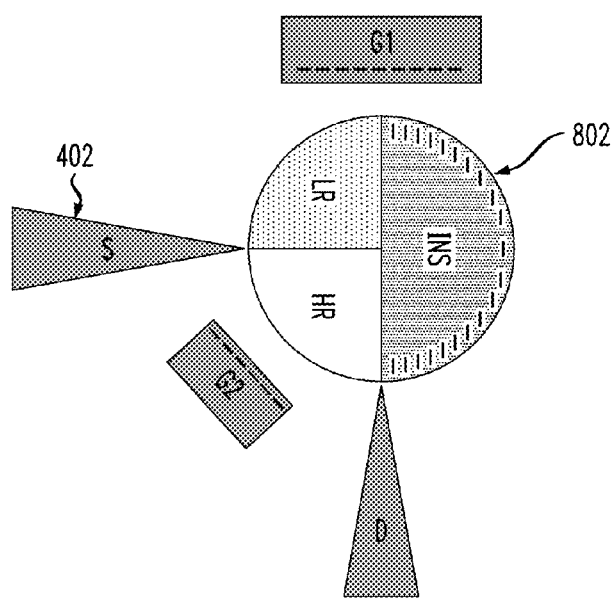
FIG. 10B illustrates further operation of the synapse device of FIG. 9 generating a minimum output current, according to an embodiment of the invention.

FIGS. 10A and 10B illustrate two operational states of the synapse device presented in FIG. 9. In both FIGS. 10A and 10B, the isolation material carries a fixed negative charge. In FIG. 10A, G1 is supplied with a positive voltage and G2 is supplied with no voltage. In this configuration, both the source and drain electrodes are in contact with the low resistance region of the multi-faced component 802, generating a maximum output current. In contrast, in FIG. 10B, G1 is supplied with a negative voltage and G2 is also supplied with a negative voltage. In this configuration, both the source and drain electrodes are in contact with the high resistance region of the multi-faced component 802, generating a minimum output current. The device in FIG. 9 may be assumed generate an output current in between the range of output currents generated in FIGS. 10A and 10B.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. An electromechanical device, comprising:
a substrate structure;
a plurality of electrodes formed over the substrate structure;
an anchor trench formed adjacent to the plurality of electrodes; and
a multi-faced component formed in the anchor trench and in operable proximity with the plurality of electrodes, wherein the multi-faced component comprises an isolation region formed on a first portion of the surface of the multi-faced component, a high resistance region formed on a second portion of the surface of the multi-faced component, and a low resistance region formed on a third portion of the surface of the multi-faced component; and
wherein the electromechanical device is configured to provide an analog resistive-response output, ranging between the high resistance region and the low resistance region, from at least one of the plurality of electrodes in response to a control input.

2. The device of claim 1, wherein the plurality of electrodes comprises at least a set of source and drain electrodes and a set of gate electrodes.

3. The device of claim 2, wherein the anchor trench is formed between the set of source and drain electrodes.

4. The device of claim 2, wherein the multi-faced component formed in the anchor trench is in contact with the set of source and drain electrodes.

5. The device of claim 1, wherein the first portion of the surface of the multi-faced component is about a half of the surface of the multi-faced component.

6. The device of claim 5, wherein the second portion of the surface of the multi-faced component is about a quarter of the surface of the multi-faced component and the third portion of the surface of the multi-faced component is about a quarter of the surface of the multi-faced component.

7. The device of claim 1, further comprising a back gate formed on the substrate structure operable to position the multi-faced component in the anchor trench during the formation of the multi-faced component.

8. The device of claim 7, wherein the back gate is supplied with one of a positive and negative charge and the first portion of the surface of the multi-faced component is coated with the other of the positive and negative charge during the formation of the multi-faced component.

* * * * *